US010610994B2

(12) United States Patent
Lau et al.

(10) Patent No.: US 10,610,994 B2
(45) Date of Patent: Apr. 7, 2020

(54) POLISHING SYSTEM WITH LOCAL AREA RATE CONTROL AND OSCILLATION MODE

(71) Applicant: Applied Materials, Inc., Santa Clara, CA (US)

(72) Inventors: Eric Lau, Santa Clara, CA (US); Hui Chen, Burlingame, CA (US); King Yi Heung, Union City, CA (US); Chih Chung Chou, San Jose, CA (US); Edwin C. Suarez, Fremont, CA (US); Garrett Ho Yee Sin, San Jose, CA (US); Charles C. Garretson, Sunnyvale, CA (US); Jeonghoon Oh, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/456,413

(22) Filed: Mar. 10, 2017

(65) Prior Publication Data
US 2017/0274495 A1     Sep. 28, 2017

Related U.S. Application Data

(60) Provisional application No. 62/344,106, filed on Jun. 1, 2016, provisional application No. 62/313,411, filed on Mar. 25, 2016.

(51) Int. Cl.
*B24B 37/10* (2012.01)
*H01L 21/687* (2006.01)
(Continued)

(52) U.S. Cl.
CPC .............. *B24B 37/10* (2013.01); *B24B 37/20* (2013.01); *B24B 57/02* (2013.01); *H01L 21/67092* (2013.01); *H01L 21/68785* (2013.01)

(58) Field of Classification Search
CPC ......... B24B 37/10; B24B 37/20; B24B 57/02; H01L 21/67092; H01L 21/68785
See application file for complete search history.

(56) References Cited

U.S. PATENT DOCUMENTS 5,759,918 A * 6/1998 Hoshizaki ............... B24B 7/241
                                                          438/692
5,840,202 A * 11/1998 Walsh .................... B24B 53/017
                                                          216/52
(Continued)

FOREIGN PATENT DOCUMENTS

JP           4675803 B2     4/2011

OTHER PUBLICATIONS

International Search Report and Written Opinion for Application No. PCT/US2017/018805 dated Jun. 2, 2017.

*Primary Examiner* — Marc Carlson
(74) *Attorney, Agent, or Firm* — Patterson + Sheridan LLP

(57) ABSTRACT

A polishing module includes a chuck having a substrate receiving surface and a perimeter, and one or more polishing pad assemblies positioned about the perimeter of the chuck, wherein each of the one or more polishing pad assemblies are coupled to an actuator that provides movement of the respective polishing pad assemblies in a sweep direction, a radial direction, and a oscillating mode relative to the substrate receiving surface and are limited in radial movement to about less than one-half of the radius of the chuck as measured from the perimeter of the chuck.

20 Claims, 8 Drawing Sheets

(51) Int. Cl.
*H01L 21/67* (2006.01)
*B24B 37/20* (2012.01)
*B24B 57/02* (2006.01)

(56) References Cited

U.S. PATENT DOCUMENTS

| | | | |
|---|---|---|---|
| 5,931,719 A | 8/1999 | Nagahara et al. | |
| 5,934,979 A * | 8/1999 | Talieh | B24B 21/004 451/271 |
| 6,165,057 A | 12/2000 | Gill, Jr. | |
| 6,296,550 B1 * | 10/2001 | Liu | B24B 37/11 451/287 |
| 6,413,388 B1 * | 7/2002 | Uzoh | B23H 5/08 204/224 M |
| 6,439,979 B1 * | 8/2002 | Beppu | B24B 37/12 451/285 |
| 6,520,843 B1 * | 2/2003 | Halley | B24B 9/065 451/285 |
| 6,712,678 B1 * | 3/2004 | Wada | B24B 53/017 451/285 |
| 6,857,946 B2 * | 2/2005 | Zuniga | B24B 37/32 451/288 |
| 7,520,939 B2 * | 4/2009 | Ho | B08B 3/02 134/26 |
| 7,993,485 B2 * | 8/2011 | Wasinger | B24B 1/04 156/345.12 |
| 8,133,096 B2 * | 3/2012 | Emami | B24D 7/14 451/285 |
| 8,142,260 B2 * | 3/2012 | Kollata | H01L 21/02087 451/168 |
| 9,180,570 B2 * | 11/2015 | Kerprich | B24B 37/26 |
| 2001/0000497 A1 * | 4/2001 | Epshteyn | B24B 37/013 438/691 |
| 2002/0033230 A1 * | 3/2002 | Hayashi | B24B 37/30 156/345.12 |
| 2002/0132566 A1 * | 9/2002 | Jeong | B24B 37/30 451/57 |
| 2005/0221721 A1 * | 10/2005 | Valle | B24B 13/0052 451/11 |
| 2007/0149096 A1 * | 6/2007 | Nishimura | B24B 37/26 451/41 |
| 2008/0102737 A1 * | 5/2008 | Chang | B24B 53/017 451/56 |
| 2009/0081932 A1 * | 3/2009 | O'Moore | B24B 37/26 451/490 |
| 2010/0035526 A1 * | 2/2010 | Tolles | B08B 1/007 451/57 |
| 2012/0190281 A1 * | 7/2012 | Allison | B24B 37/26 451/527 |
| 2012/0282849 A1 * | 11/2012 | Kerprich | B24B 37/005 451/527 |
| 2013/0137350 A1 * | 5/2013 | Allison | B24B 37/16 451/539 |
| 2013/0288578 A1 * | 10/2013 | Chen | B24B 37/107 451/59 |
| 2014/0206268 A1 * | 7/2014 | Lefevre | B24B 37/22 451/529 |
| 2015/0111478 A1 * | 4/2015 | Chen | B24B 37/10 451/72 |
| 2015/0352686 A1 * | 12/2015 | Wu | B24B 49/04 438/14 |
| 2016/0005618 A1 * | 1/2016 | Chen | B24B 37/10 451/41 |
| 2016/0016281 A1 * | 1/2016 | Chen | B24B 37/10 156/345.12 |

* cited by examiner

POLISHING SYSTEM WITH LOCAL AREA RATE CONTROL AND OSCILLATION MODE

CROSS-REFERENCE TO RELATED APPLICATIONS

This application claims benefit of U.S. Provisional Application Ser. No. 62/313,411, filed Mar. 25, 2016 and U.S. Provisional Application Ser. No. 62/344,106, filed Jun. 1, 2016; both applications are hereby incorporated by reference herein.

BACKGROUND

Field

Embodiments of the present disclosure generally relate to methods and apparatus for polishing a substrate, such as a semiconductor wafer. More particularly, to methods and apparatus for polishing local areas of a substrate in an electronic device fabrication process.

Description of the Related Art

Chemical mechanical polishing is one process commonly used in the manufacture of high-density integrated circuits to planarize or polish a layer of material deposited on a substrate by moving a feature side, i.e., a deposit receiving surface, of the substrate in contact with a polishing pad while in the presence of a polishing fluid. In a typical polishing process, the substrate is retained in a carrier head that urges or presses the backside of the substrate toward a polishing pad. Material is removed globally across the surface of the feature side of the substrate that is in contact with the polishing pad through a combination of chemical and mechanical activity.

The carrier head may contain multiple individually controlled pressure regions that apply differential pressure to different regions of the substrate. For example, if greater material removal is desired at peripheral edges of the substrate as compared to the material removal desired at the center of the substrate, the carrier head may be used to apply more pressure to the peripheral edges of the substrate. However, the stiffness of the substrate tends to redistribute the pressure applied to local regions of the substrate by the carrier head such that the pressure applied to the substrate may be spread or smoothed generally across the entire substrate. The smoothing effect makes local pressure application, for local material removal, difficult if not impossible.

Therefore, there is a need for a method and apparatus that facilitates removal of materials from local areas of the substrate.

SUMMARY

Embodiments of the present disclosure generally relate to methods and apparatus for polishing local areas of a substrate, such as a semiconductor wafer. In one embodiment, a polishing module is provided. The polishing module includes a chuck having a substrate receiving surface and a perimeter, and one or more polishing pad assemblies positioned about the perimeter of the chuck, wherein each of the one or more polishing pad assemblies are coupled to an actuator that provides movement of the respective polishing pad assemblies in one or more of a sweep direction, a radial direction, and a oscillating mode relative to the substrate receiving surface, and are limited in radial movement to about less than one-half of the radius of the chuck as measured from the perimeter of the chuck.

In another embodiment, a polishing module is provided. The module includes a chuck having a substrate receiving surface and a perimeter, a polishing head disposed about the perimeter, and a polishing pad assembly disposed in a housing that is coupled to the polishing head, wherein each of the polishing heads are coupled to an actuator that provides movement of the respective polishing pad assemblies in a sweep direction and a radial direction that is less than about one-half of a radius of the chuck, and the polishing head includes an actuator assembly that provides oscillating movement between the polishing pad assembly and the housing.

In another embodiment, a polishing module is provided. The module includes a chuck having a substrate receiving surface and a perimeter, and a plurality of polishing heads positioned about the perimeter of the chuck, each of the polishing heads coupled to a respective housing having a polishing pad assembly disposed thereon, wherein each of the polishing heads are coupled to an actuator that provides movement of the respective polishing pad assemblies in a sweep direction and a radial direction that is less than about one-half of a radius of the chuck, and the polishing head includes a motor that is coupled to a shaft and a rotor that provides oscillating movement between the polishing pad assembly and the housing.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure provide a polishing module utilized to polish local areas of a substrate. Benefits of the disclosure include improved local polishing control with limited dishing and/or erosion in the local areas. Embodiments of the polishing module as described herein may remove a material thickness of about 20 Angstroms (Å) to about 200 Å on a substrate, and in some embodiments, a material thickness of about 10 Å to about 200 Å may be removed. In some embodiments, the material may be removed with an accuracy of about +/−5 Å. Embodiments described herein may be used to perform thickness corrections on local areas of any type of film disposed on a substrate or substrate material itself (e.g., silicon), and may also be used for edge bevel polishing. A local area of a substrate may be defined as a surface area on the substrate of about 6 millimeters (mm) by about 6 mm, or greater, such as up to about 20 mm by about 20 mm, or even up to about 50 mm by about 50 mm. In some embodiments, the local area of a substrate may be the surface area occupied by one die. In some embodiments, the polishing module may be utilized to polish areas on a surface of a substrate having any desirable shape, such as rectangular shaped regions, sectors, annular regions, interconnected rectangular areas or any other desirably shaped region on the surface of a substrate. However, in some embodiments, the polishing module may be utilized to polish any area of a substrate depending on the location(s) in need of polishing as defined by user specifications.

Figure 1:
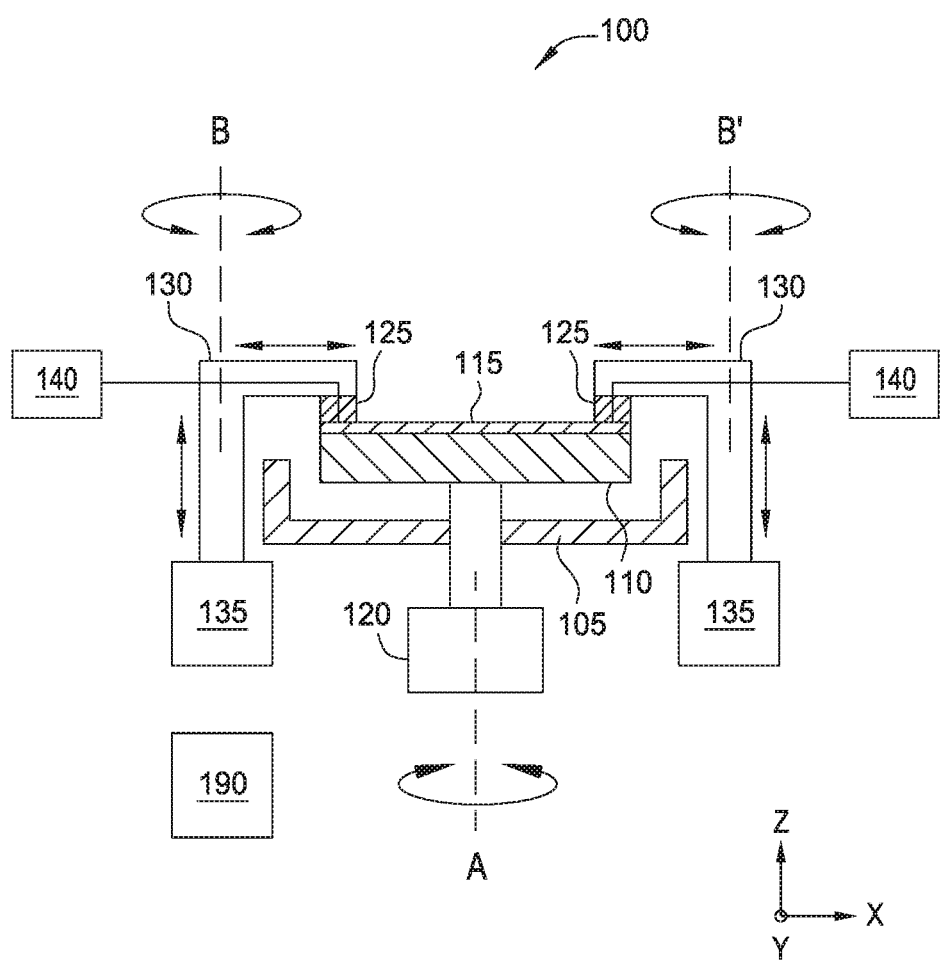
FIG. 1 is a schematic sectional view of one embodiment of a polishing module.

FIG. 1 is a schematic sectional view of one embodiment of a polishing module 100. The polishing module 100 includes a base 105 supporting a chuck 110, which rotatably supports a substrate 115 thereon. The chuck 110 may be a vacuum chuck, in one embodiment. The chuck 110 is coupled to a drive device 120, which may be a motor or actuator, providing at least rotational movement of the chuck 110 about axis A (oriented in the Z direction). The polishing module 100 may be used before a conventional polishing process or after a conventional polishing process to polish local areas of the substrate 115 and/or perform thickness corrections on the substrate 115. In some embodiments, the polishing module 100 may be used to polish and/or remove material in an area above individual die on the substrate 115.

The substrate 115 is disposed on the chuck 110 in a "face-up" orientation such that the feature side of the substrate 115 faces one or more polishing pad assemblies 125. Each of the one or more polishing pad assemblies 125 is utilized to polish or remove material from the substrate 115. The polishing pad assemblies 125 may be used to remove material from local areas of the substrate 115 and/or polish a peripheral edge of the substrate 115 before or after polishing of the substrate 115 in a conventional chemical mechanical polishing (CMP) system. The one or more polishing pad assemblies 125 comprise a commercially available CMP polishing pad material, such as polymer based pad materials typically utilized in CMP processes.

Each of the one or more polishing pad assemblies 125 are coupled to a support arm 130 that moves the polishing pad assemblies 125 relative to the substrate 115. Each of the support arms 130 may be coupled to an actuator system 135 that moves the support arm 130 (and the polishing pad assembly 125 mounted thereon) vertically (Z direction) as well as laterally (X and/or Y direction) relative to the substrate 115 mounted on the chuck 110. The actuator system 135 may also be utilized to move the support arm 130 (and the polishing pad assembly 125 mounted thereon) in an orbital, arcuate, circular or oscillating motion relative to the substrate 115. The actuator system 135 may also be utilized to move the support arm 130 (and the polishing pad assembly 125 mounted thereon) about axis B and B' to provide a sweeping motion in theta directions about their respective axes.

In one embodiment, a polishing fluid from a fluid source 140 may be applied to the polishing pad assembly 125 and/or the substrate 115. The fluid source 140 may also provide de-ionized water (DIW) to the polishing pad assembly 125 and/or the substrate 115 in order to facilitate cleaning. The fluid source 140 may also provide a gas such as clean dry air (CDA), to the polishing pad assembly 125 in order to adjust pressure applied to the polishing pad assembly 125. The base 105 may be utilized as a basin to collect polishing fluid and/or DIW that has flowed off of the edges of the substrate 125.

Generally, the polishing module 100 includes a system controller 190 that is configured to control the automated aspects of the polishing module 100. The system controller 190 facilitates the control and automation of the overall polishing module 100 and may include a central processing unit (CPU) (not shown), memory (not shown), and support circuits (or I/O) (not shown). The CPU may be one of any form of computer processors that are used in industrial settings for controlling various processes and hardware (e.g., actuators, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU to perform one or more activities. The support circuits are also connected to the CPU for supporting the processor in a conventional manner. The support circuits may include cache, power supplies, clock circuits, input/output circuitry, subsystems, and the like. A program (or computer instructions) readable by the system controller 190 determines which tasks are performable by the various components in the polishing module 100. Preferably, the program is software readable by the system controller 190, which includes code to generate and store at least substrate positional information, the sequence of movement of the various controlled components, coordinate the movement of various components in the polishing module 100 (e.g., the support arm 130, the polishing pad assembly 125 and the movement of the substrate 115) and any combination thereof.

Figure 2:
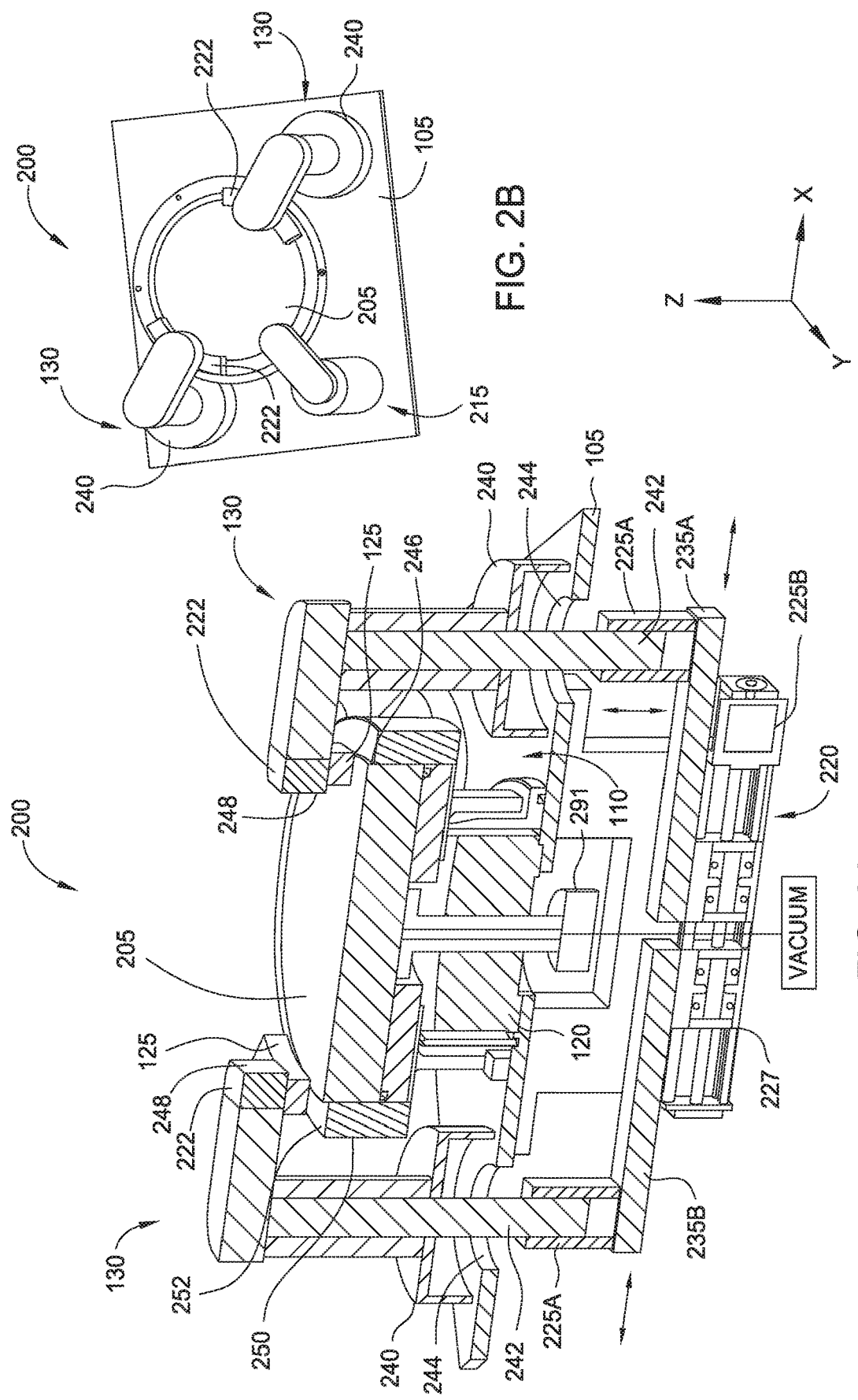
FIG. 2A is a side cross-sectional view of another embodiment of a polishing module.
FIG. 2B is an isometric top view of the polishing module shown in FIG. 2A.

FIG. 2A is a side cross-sectional view of another embodiment of a polishing module 200. FIG. 2B is an isometric top view of the polishing module 200 shown in FIG. 2A. The polishing module 200 includes the chuck 110 which in this embodiment is coupled to a vacuum source. The chuck 110 includes a substrate receiving surface 205 that includes a plurality of openings (not shown) that are in communication with the vacuum source such that a substrate (shown in FIG. 1) disposed on the substrate receiving surface 205 may be secured thereon. The chuck 110 also includes the drive device 120 that rotates the chuck 110. Each of the support arms 130 comprises a polishing head 222 that includes the polishing pad assembly 125.

A metrology device 215 (shown in FIG. 2B) may also be coupled to the base 105. The metrology device 215 may be utilized to provide an in-situ metric of polishing progress by measuring a metal or dielectric film thickness on the substrate (not shown) during polishing. The metrology device 215 may be an eddy current sensor, an optical sensor, or other sensing device that may be used to determine metal or dielectric film thickness. Other methods for ex-situ metrology feedback include pre-determining parameters such as location of thick/thin areas of deposition on the wafer, the motion recipe for the chuck 110 and/or the polishing pad assemblies 125, polishing time, as well as the downforce or pressure to be used. Ex-situ feedback can also be used to determine the final profile of the polished film. In situ metrology can be used to optimize polishing by monitoring progress of the parameters determined by the ex-situ metrology.

Each of the support arms 130 are movably mounted on the base 105 by an actuator assembly 220. The actuator assembly 220 includes a first actuator 225A and a second actuator 225B. The first actuator 225A may be used to move each support arm 130 (with the respective polishing head 222) vertically (Z direction) and the second actuator 225B may be used to move each support arm 130 (with the respective polishing head 222) laterally (X direction, Y direction, or combinations thereof). The first actuator 225A may also be used to provide a controllable downforce that urges the polishing pad assemblies 125 towards the substrate receiving surface 205. While only 2 support arms 130 and polishing heads 222 having polishing pad assemblies 125 thereon are shown in FIGS. 2A and 2B, the polishing module 200 is not limited to this configuration. The polishing module 200 may include any number of support arms 130 and polishing heads 222 as allowed by the circumference (e.g., the perimeter) of the chuck 110 and sufficient space allowance for the metrology device 215, as well as space for sweeping movement of the support arms 130 (with the polishing heads 222 and polishing pad assemblies 125 mounted thereon).

The actuator assembly 220 may comprise a linear movement mechanism 227, which may be a slide mechanism or ball screw coupled to the second actuator 225B. Likewise, each of the first actuators 225A may comprise a linear slide mechanism, a ball screw, or a cylinder slide mechanism that moves the support arm 130 vertically. The actuator assembly 220 also includes support arms 235A, 235B coupled between the first actuator 225A and the linear movement mechanism 227. Each of the support arms 235A, 235B may be actuated simultaneously or individually by the second actuator 225B. Thus, lateral movement of the support arms 130 (and polishing pad assemblies 125 mounted thereon) may sweep across the substrate (not shown) in a synchronized or non-synchronized manner. In some embodiments, each of the support arms 235A, 235B is actuated by an actuator that causes one or more of the support arms to sweep across the surface of the substrate in a synchronized manner with the movement of the substrate by a rotary actuator 291. A dynamic seal 240 may be disposed about a support shaft 242 that may be part of the first actuator 225A.

The dynamic seal 240 may be a labyrinth seal that is coupled between the support shaft 242 and the base 105.

The support shaft 242 is disposed in an opening 244 formed in the base 105 that allows lateral movement of the support arms 130 based on the movement provided by the actuator assembly 220. The opening 244 is sized to allow sufficient lateral movement of the support shaft 242 such that the support arms 130 (and polishing heads 222 mounted thereon) may move from a perimeter 246 of the substrate receiving surface 205 toward the center thereof to about one half the radius of the substrate receiving surface 205. In one embodiment, the substrate receiving surface 205 has a diameter that is substantially the same as the diameter of a substrate that would be mounted thereon during processing. For example, if the radius of the substrate receiving surface 205 is 150 mm, the support arms 130, particularly the polishing pad assemblies 125 mounted thereon, may move radially from about 150 mm (e.g., from the perimeter 246) to about 75 mm inward toward the center of the substrate receiving surface 205, and back to the perimeter 246. The term "about" may be defined as 0.00 mm (zero mm) to no more than 5 mm past one half of the radius of the substrate receiving surface 205 which is about 75 mm in the example above. In another example, the support arms 130 may move from a position that at the perimeter 246 of the substrate to the center of the round substrate, and back to the perimeter 246. In yet another example, the support arms 130 may move from a position that is inside the perimeter 246 of the substrate to a position that is between the center of the substrate and the perimeter 246, and then back again.

Additionally, the opening 244 is sized to allow sufficient lateral movement of the support shaft 242 such that an end 248 of the support arms 130 may be moved outward of a perimeter 250 of the chuck 110. Thus, when the polishing heads 222 are moved outward to clear the perimeter 250, a substrate may be transferred onto or off of the substrate receiving surface 205. The substrate may be transferred by a robot arm or end effector to or from a conventional polishing station before or after a global CMP process.

Figure 3:
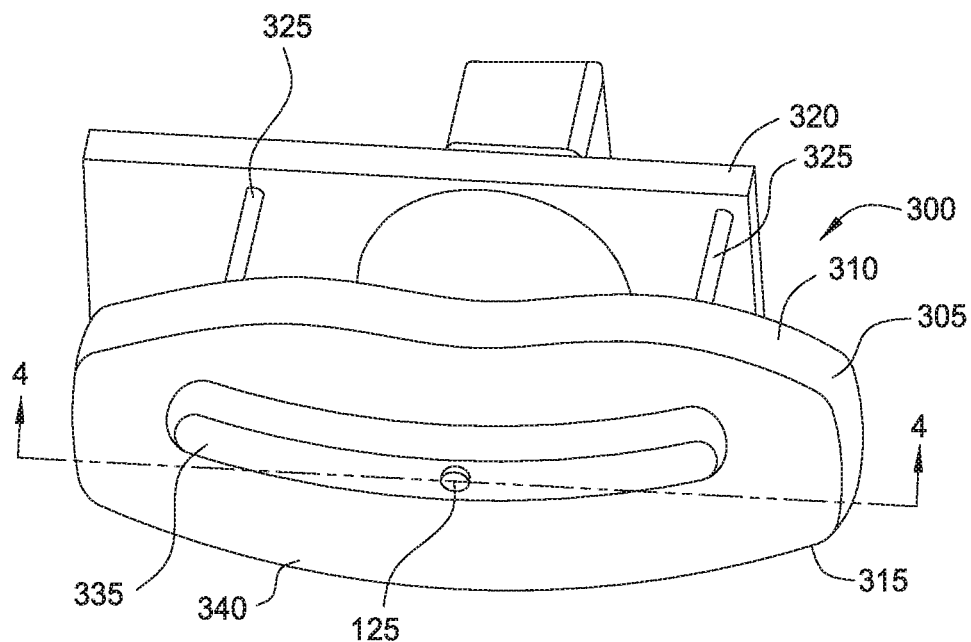
FIG. 3 is an isometric bottom view of one embodiment of a polishing head.
Figure 4:
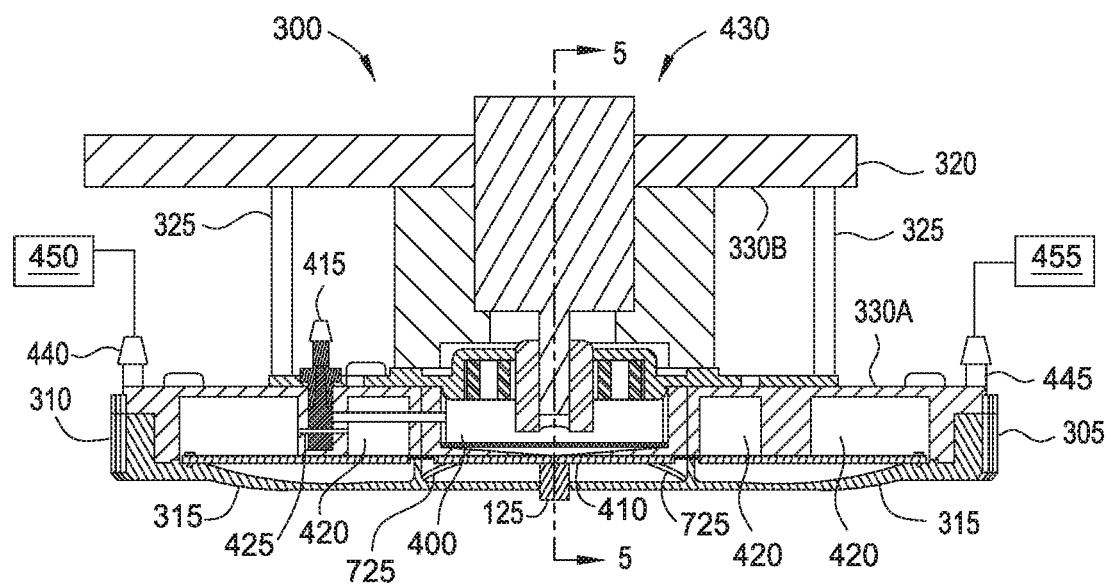
FIG. 4 is a cross-sectional view of the polishing head along line 4-4 of FIG. 3.

FIG. 3 is an isometric bottom view of one embodiment of a polishing head 300 and FIG. 4 is a cross-sectional view of the polishing head 300 along line 4-4 of FIG. 3. The polishing head 300 may be utilized as one or more of the polishing heads 222 shown in FIGS. 2A and 2B. The polishing head 300 includes a polishing pad assembly 125 movable relative to a housing 305. The polishing pad assembly 125 may be round as shown, an oval shape, an arcuate shaped, or include a polygonal shape, such as square or rectangular. The housing 305 may include a rigid wall 310 and a housing base 315 that is flexible or semi-flexible. The housing base 315 may contact a surface of a substrate and is generally compliant such that the housing base 315 flexes in response to such contact. The housing 305 as well as the housing base 315 may be made of a polymer material, such as polyurethane, PET (polyethylene terephthalate), or another suitable polymer having sufficient hardness and/or strength. Other examples may include polyether ether ketone (PEEK) or polyphenylene sulfide (PPS). In some embodiments, the hardness may be about 95 Shore A, or greater. The polishing pad assembly 125 extends through an opening in the housing base 315.

Both of the housing base 315 and the polishing pad assembly 125 may be movable relative to each other during a polishing process. The housing 305 is coupled to a support member 320 that is in turn coupled to a respective support arm 130 (shown in FIGS. 1-2B). The housing 305 is laterally movable relative to the support member 320 (e.g., in the X and/or Y directions) and are coupled together by one or more flexible posts 325. The number of flexible posts 325 per polishing head 300 may be four or another number, although only two are shown in FIGS. 3 and 4. The flexible posts 325 are utilized to maintain a parallel relationship between a plane 330A of the housing 305 and a plane 3306 of the support member 320. The flexible posts 325 may be made of a plastic material, such as nylon or other flexible plastic materials. Lateral movement may be provided by friction between the housing base 315 and a surface of a substrate (not shown). However, the lateral movement may be controlled by the flexible posts 325. Additionally, lateral movement may be provided by an actuator assembly (described below) disposed in the polishing head 300.

Another degree of relative movement of the polishing pad assembly 125 may be provided by a pressure chamber 400 provided in the housing 305. The pressure chamber 400 may be bounded by a bearing cap 405 and a flexible membrane 410 coupled to the polishing pad assembly 125. While being flexible, the hardness of the flexible membrane 410 may be about 55 Shore A to about 65 Shore A, in some embodiments. Compressed fluids, such as clean dry air, may be provided to the pressure chamber 400 via a fluid inlet 415 that is in fluid communication with the pressure chamber 400 by a plenum 420 positioned laterally relative to the pressure chamber 400. The plenum 420 may be bounded by surfaces of the housing 305 and the flexible membrane 410. The volumes of the pressure chamber 400 and the plenum 420 may be fluidly separated from a volume 425 between the flexible membrane 410 and the housing base 315 such that fluids are contained therein and/or the volume 425 is at a pressure lower than a pressure of the plenum 420 (as well as the plenum 420 (e.g., at ambient or room pressure, or slightly above room pressure). Fluids provided to the plenum 420 provide a downforce to the polishing pad assembly 125 by applying a controllable force against the flexible membrane 410. The downforce may be varied as needed such that movement of the polishing pad assembly 125 is provided or controlled in the Z direction.

Another degree of relative movement of the polishing pad assembly 125 may be provided by an actuator assembly 430 disposed in the polishing head 300. For example, the actuator assembly 430 may be utilized to facilitate movement of the polishing head 300 relative to a surface of a substrate described in more detail in FIG. 5. In some configurations, the actuator assembly 430 may be utilized to facilitate a rotational, rotational at distance (e.g., precession about an off-center axis), orbital, elliptical or linear movement of the polishing head 300 relative to a surface of a substrate.

Figure 5:
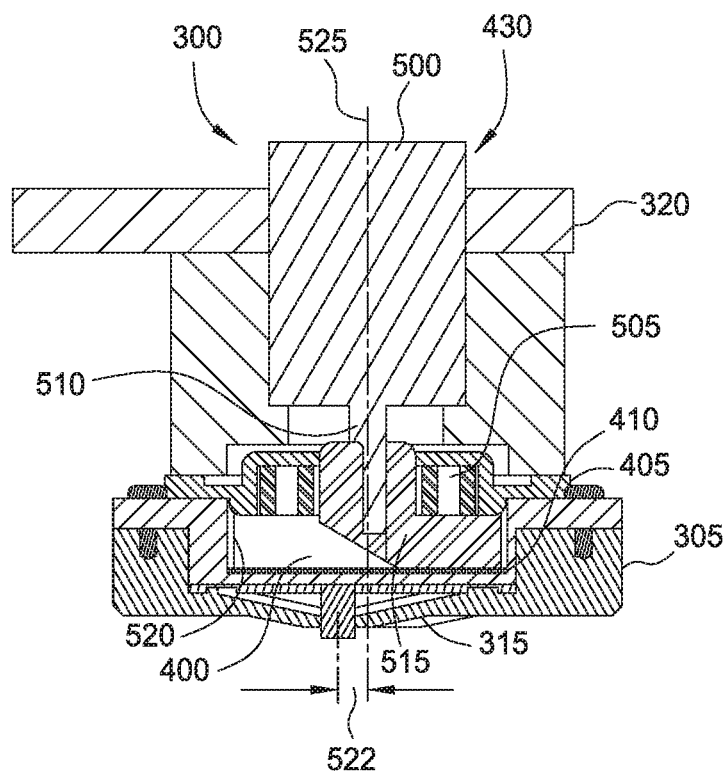
FIG. 5 is a cross-sectional view of the polishing head along line 5-5 of FIG. 4.

FIG. 5 is a cross-sectional view of the polishing head 300 along line 5-5 of FIG. 4. The actuator assembly 430 includes a motor 500 and a bearing 505 circumscribing a shaft 510. The shaft 510 is coupled to a rotor 515, and one of the rotor 515 and the shaft 510 is an eccentrically shaped member. For example, one of the shaft 510 and the rotor 515 is eccentric such that the rotor 515 intermittently contacts an interior wall 520 of the pressure chamber 400 when the shaft 510 is rotated. The eccentric motion may be a dimension 522 of about +/−1 mm from a centerline 525 of the motor 500. The intermittent contact may be controlled by the rotational speed of the shaft 510 (e.g., revolutions per minute of the shaft 510) during operation. The intermittent contact may move the housing 305 laterally (in the X/Y plane) during operation such that the polishing pad assembly 125 oscillates at a desired speed. The oscillation may provide additional removal of material from a surface of a substrate (not shown). The movement of the housing 305, as well as parallelism of the housing 305 with the support member 320, may be controlled by the flexible posts 325 (shown in FIG. 4).

Figure 6:
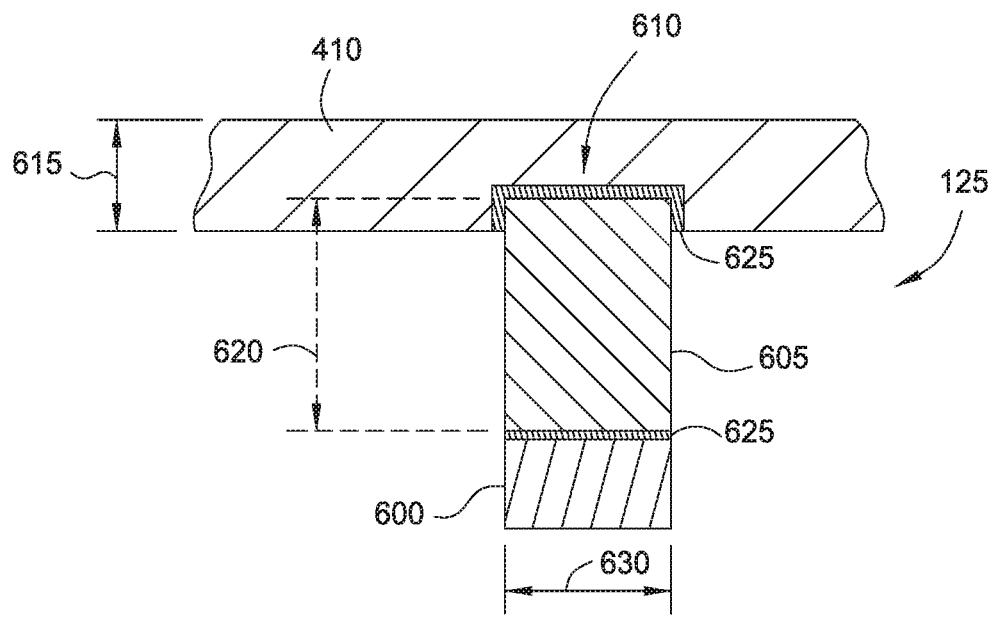
FIG. 6 is a cross-sectional view of a polishing pad assembly according to one embodiment.

FIG. 6 is a cross-sectional view of the polishing pad assembly 125 according to one embodiment. The polishing pad assembly 125 includes a first or contact portion 600 and a second or support portion 605. The contact portion 600 may be a conventional polishing pad material, such as commercially available polishing pad material, for example polymer based pad materials typically utilized in CMP processes. The polymer material may be a polyurethane, a polycarbonate, fluoropolymers, polytetrafluoroethylene (PTFE), polyphenylene sulfide (PPS), or combinations thereof. The contact portion 600 may further comprise open or closed cell foamed polymers, elastomers, felt, impregnated felt, plastics, and like materials compatible with the processing chemistries. In another embodiment, the contact portion 600 is a felt material impregnated with a porous coating. In another embodiment, the contact portion 600 comprises a pad material available from DOW® that is sold under the tradename IC1010™.

The support portion 605 may be a polymer material, such as high density polyurethane, polyethylene, a material sold under the tradename DELRIN®, PEEK, or another suitable polymer having sufficient hardness. The contact portion 600 may be coupled to the support portion 605 by an adhesive 625, such as s pressure sensitive adhesive, epoxy, or other suitable adhesive. Likewise, the polishing pad assembly 125 may be adhered to the flexible membrane 410 by the adhesive 625. In some embodiments, the support portion 605 of the polishing pad assembly 125 is disposed in a recess 610 formed in the flexible membrane 410.

In some embodiments, a thickness 615 of the flexible membrane 410 is about 1.45 mm to about 1.55 mm. In some embodiments a length 620 of the support portion 605 is about 4.2 mm to about 4.5 mm. In the embodiment shown, where the contact portion 600 is circular, a diameter 630 of the contact portion 600 may be about 5 mm. However, in other embodiments, the contact portion 600 may have a different shape and/or a different size.

Figure 7:
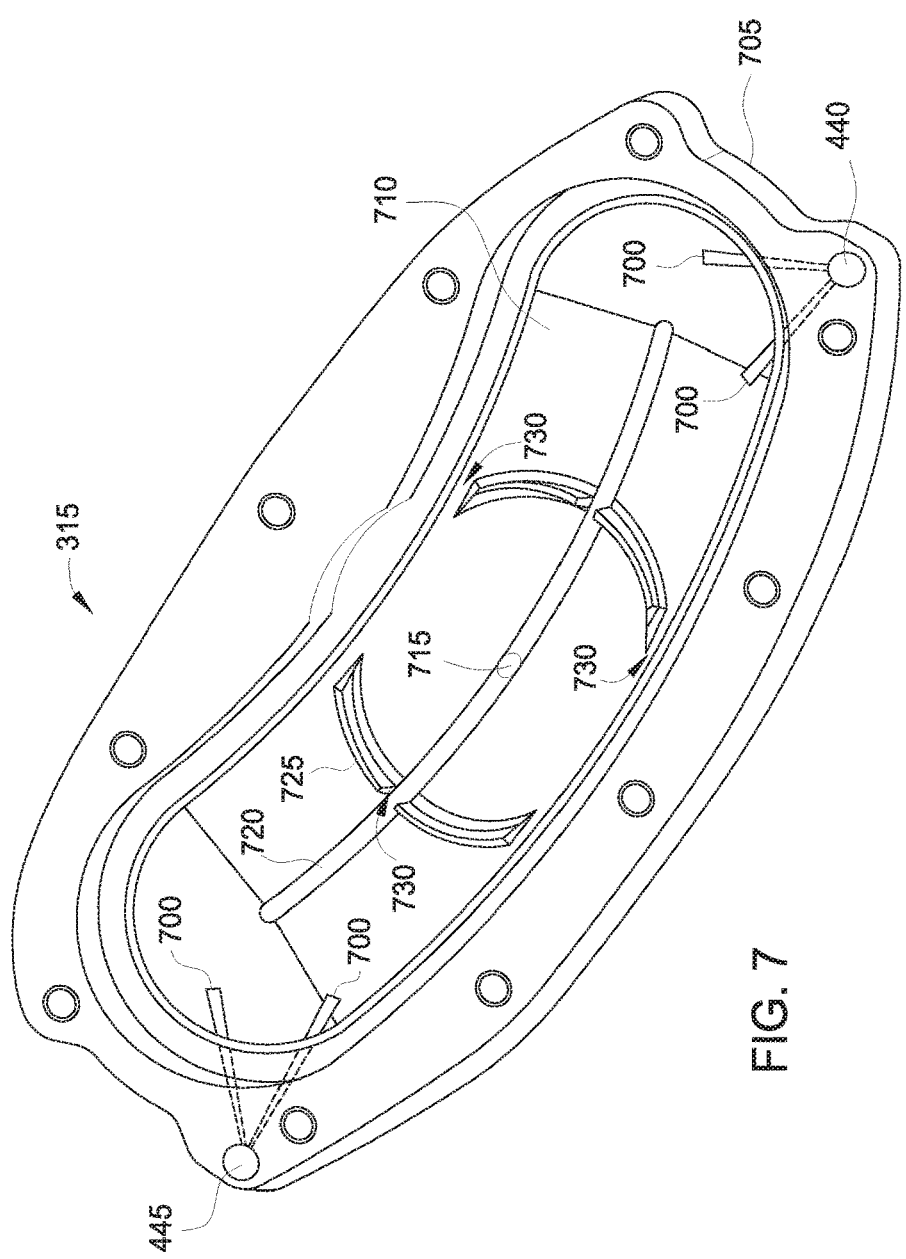
FIG. 7 is an isometric top view of the housing base of the polishing head of FIG. 3.

FIG. 7 is an isometric top view of the housing base 315 of the polishing head 300 of FIG. 3. Fluid flow within and through the housing base 315 will be explained with reference to FIGS. 3, 4 and 7.

Referring to FIG. 4, the housing 305 includes a first inlet 440 and a second inlet 445 coupled thereto. The first inlet 440 may be coupled to a water source 450, such as deionized water (DIW) and the second inlet 445 may be coupled to a polishing fluid source 455, which may be a slurry utilized in a polishing process. Both of the first inlet 440 and the second inlet 445 are in fluid communication with the volume 425 between the flexible membrane 410 and the housing base 315 by one or more channels 700 shown in FIG. 7. A portion of the channels 700 formed in a wall 705 of the housing base 315 are shown in dashed lines but the channels 700 open into an interior surface 710 of the housing base 315.

During a polishing process, polishing fluid from the polishing fluid source 455 may be provided to the volume 425 via the second inlet 445. The polishing fluid flows through the channels 700 and into the volume 425. An opening 715 is formed in the interior surface 710 of the housing base 315, the opening 715 accommodating the polishing pad assembly 125 therein. The opening 715 may be sized slightly larger than the polishing pad assembly 125 such that polishing fluid may flow through the opening 715 about the polishing pad assembly 125.

Likewise, fluid from the first inlet 440, such as DIW, may flow from the first inlet 440 to the channels 700, and to the opening 715. The fluid from the first inlet 440 may be used to clean the polishing pad assembly 125 before or after a polishing process.

In some embodiments, the housing base 315 includes a recessed portion 720 that forms a protrusion 335 that is raised from an exterior surface 340 of the housing base 315 as shown in FIG. 3. The recessed portion 720 may be a channel that facilitates fluid transportation from the channels 700 to the opening 715. The recessed portion 720 (as well as the protrusion 335) may be arc-shaped in some embodiments. In some embodiments, the housing base 315 may include baffles 725 that slow and/or controls the flow of fluids in the volume 425. Walls of the baffles 725 may extend to the flexible membrane 410 as shown in FIG. 4. The baffles 725 may include one or more openings 730 to provide fluid flow therethrough.

Figure 8:
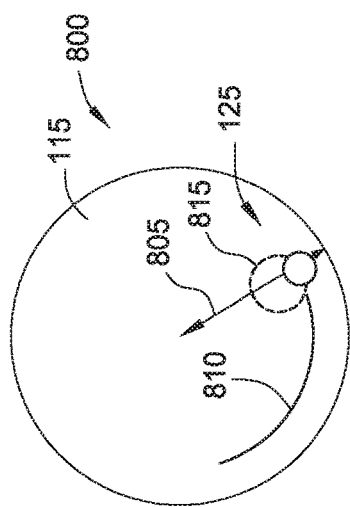
FIG. 8 is a schematic plan view of a polishing module showing various motion modes of a polishing pad assembly on a substrate as described herein.

FIG. 8 is a schematic plan view of a polishing module 800 showing various motion modes of the polishing pad assembly 125 on a substrate 115 as described herein. The polishing module 800 may be similar to the polishing module 100 and 200 shown in FIGS. 1-2B but portions are not shown for clarity.

The polishing pad assembly 125, mounted on a support arm 130 (shown in FIGS. 1-2B) may move in one or any combination of a radial direction 805, a sweep direction 810 in theta, and an oscillation mode or a circular direction 815. The circular direction 815 may comprise a vibrating force during polishing of a substrate. The multiple degrees of freedom of the polishing pad assembly 125 facilitate greater control and accuracy for polishing the substrate 115.

Figure 9:
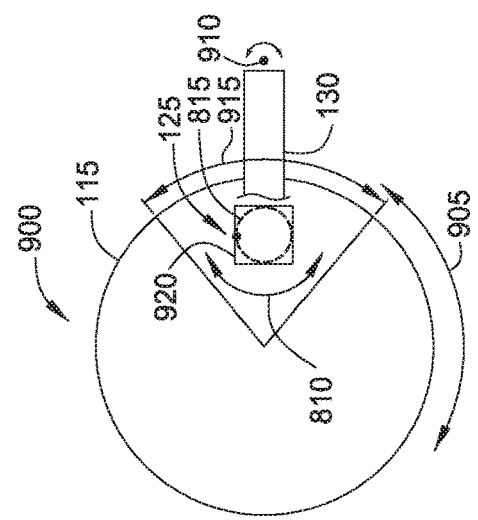
FIG. 9 is a schematic plan view of a polishing module showing another embodiment of various motion modes of the polishing pad assembly.

FIG. 9 is a schematic plan view of a polishing module 900 showing various movements of the polishing pad assembly 125 across a substrate 115 as well as movements of the substrate 115 during processing. The polishing module 900 shown in FIG. 9 may be similar to the polishing module 100 and 200 shown in FIGS. 1-2B, however, some portions are not shown for clarity.

In one embodiment, the substrate 115 (mounted on the chuck 110 (shown in FIGS. 2A and 2B)) may move in a rotational direction 905, or theta direction. The rotational direction 905 may be a back and forth motion (e.g., clockwise and counterclockwise, or vice versa). The polishing pad assembly 125, mounted on the support arm 130, may move in a combination of the sweep direction 810 in theta (facilitated by the support arm 130 moving about an axis 910 (e.g., axis B or B' in FIG. 1)). While the support arm 130 moves about the axis 910 in order to move the polishing pad assembly 125 in the sweep direction 810, the polishing pad assembly 125 is moved in a desired way, such as in a circular direction 815. In addition, while the support arm 130 moves about the axis 910, and the polishing pad assembly 125 is moved in the circular direction 815, the substrate 115 is moved in the rotational direction 905. In some embodiments, the system controller 190 is configured to coordinate the motion of the support arm 130, the polishing pad assembly 125 and the substrate 115 by controlling the motion of the actuators coupled to each of these different components. The rotational direction 905 may form an arc or circle shaped path, such as a path having an arc length 915. The arc length 915 may be a portion of a circle, such as about 20 degrees to about 40 degrees, for example, about 25 degrees to about 35 degrees.

The movement of the substrate 115 in the rotational direction 905 across the arc length 915 may have an angular speed that is equivalent to an average rotational speed of between about 0.1 revolutions per minute (rpm) and about 100 rpm in some embodiments. The movement of the support arm 130 in the sweep direction 810 may have an angular speed that is equivalent to an average rotational speed of between about 0.1 rpm and about 100 rpm in some embodiments. The movement of the polishing pad assembly 125 in the circular direction 815 may have a rotational speed of between about 100 rpm and about 5000 rpm, while the center of the pad is at an offset position from the center of rotation by a distance between about 0.5 mm and about 30 mm, in some embodiments. Downforce may be provided by fluids provided to the plenum 420 (FIG. 4) of the polishing pad assembly 125. In some embodiments, the downforce supplied by the polishing pad assembly 125 may be equivalent to a pressure of about 0.1 psig to about 50 psig.

Figure 10:
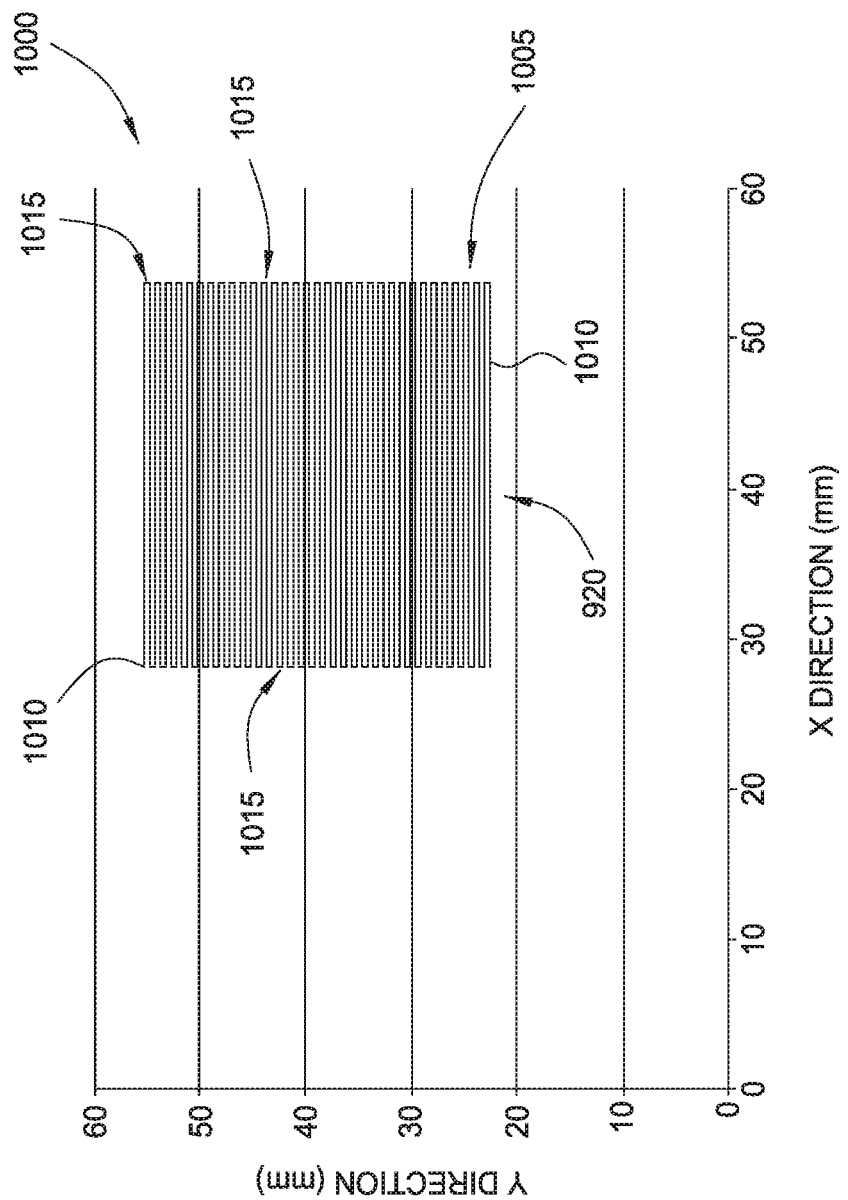
FIG. 10 is a graph showing a polishing pattern that may be produced on a local area of a substrate using the motion modes shown in FIG. 9.

FIG. 10 is a graph 1000 showing a polishing pattern 1005 that may be produced on a local area 920 of the substrate 115 using the motion modes shown in FIG. 9. The polishing pattern 1005 may resemble a raster-like pattern across the local area 920. The polishing pattern 1005 may include a plurality of first lines 1010 that represent the path of the polishing pad assembly 125 across the surface of the substrate in the local area 920. At least a portion of the first lines 1010 may be connected by second lines 1015 to form a continuous path that traverses the local area 920. Similar to the first lines 1010, the second lines 1015 represent the average position of the polishing pad assembly 125 as it traverses the local area 920 while following the polishing pattern 1005. The first lines 1010 may be substantially parallel to each other. At least a portion of the second lines 1015 may be linear and may be substantially orthogonal to the first lines 1010, in some embodiments. In other embodiments, the second lines 1015 may be curved or U-shaped.

In some embodiments, the local area 920 may be the surface area of a single die that is formed on a substrate. However, the local area 920 may include the surface area of multiple dies. In one example, the local area 920 includes a surface area of about 10 mm by about 10 mm, or larger, such as about 27 mm to about 33 mm. The polishing pattern 1005 shown in FIG. 10, which is produced by the motion of the support arm 130, the polishing pad assembly 125 and the substrate 115, as discussed above in relation to FIG. 9, may be completed in about 10 seconds to about 20 seconds. Thereafter, the polishing pad assembly 125 may be conditioned, if necessary, and prepared for providing another polishing pattern 1005 on the substrate. The process of generating the polishing pattern 1005 is described in more detail below.

Figure 11A:
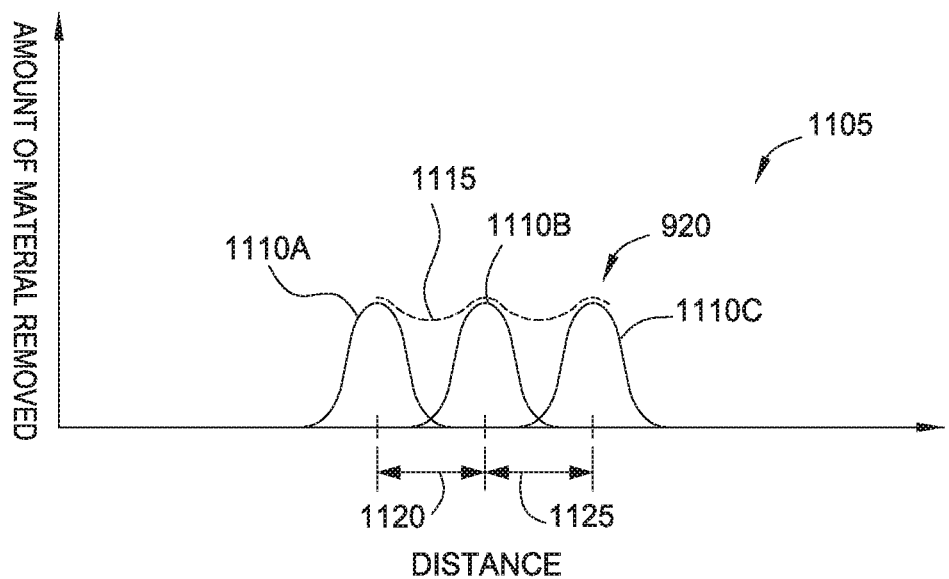
FIGS. 11A and 11B are graphs of a top surface of the local area of a substrate showing embodiments of material removed therefrom using the motion modes described in FIG. 9.
Figure 11B:
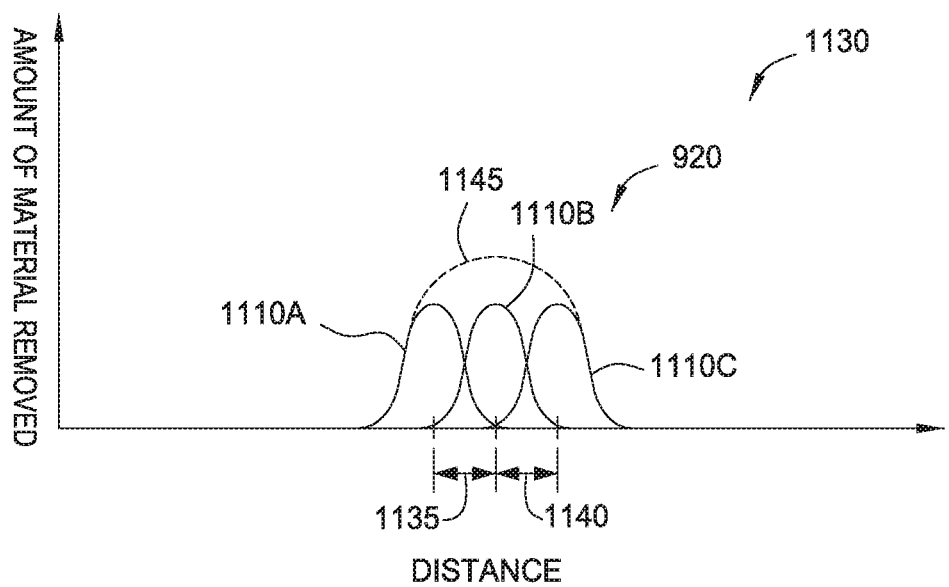

FIGS. 11A and 11B are graphs of a top surface of the local area 920 of a substrate showing embodiments of material removed therefrom using the motion described in conjunction with FIGS. 9-10.

Graph 1105 shows one embodiment of a removal profile provided by the polishing pad assembly 125 as it travers a path that follows three adjacent first lines 1010 that extend in a direction that is perpendicular to the page. The three adjacent lines are identified in FIGS. 11A and 11B as paths 1110A, 1110B and 1110C, each of which remove various amounts of material over a specified distance (e.g., illustrated by the Gaussian shaped curves) that is perpendicular to the direction of the paths 1110A-1110C. The relative position of peaks of the paths 1110A, 1110B and 1110C (i.e., average position of the polishing pad assembly 125) may define a pitch 1120, 1125 and the overlap of the paths 1110A, 1110B and 1110C may define an average amount of material removal for the polishing pad assembly 125 as it moves along the paths 1110A, 1110B and 1110C, as illustrated by dashed line 1115.

Graph 1130 shows another embodiment of a removal profile provided by three adjacent first lines 1010 shown in FIG. 10 identified as path 1110A, 1110B and 1110C. Similar to the embodiment in FIG. 11A, the paths 1110A, 1110B and 1110C remove various amounts of material over a specified distance that is perpendicular to the direction of the paths 1110A-1110C. However, peaks of the paths 1110A, 1110B and 1110C may define a pitch 1135, 1140 that is less than the pitch 1120, 1125 shown in FIG. 11A, and the overlap of which may provide an average removal of material referenced as a dashed line 1145. Due to an adjustment in the relative position of the paths 1110A, 1110B and 1110C to each other, as shown in FIGS. 11A and 11B, the shape of the average material removal profile can be adjusted (e.g., average removal profiles 1115, 1145). This removal profile may be useful when a greater amount of material needs to be removed from the local area 920. Therefore, by adjusting the relative position of two or more adjacent first lines 1010 the material removal profile can be adjusted to have a desired shape, such as a flat or uniform pattern.

Figure 12:
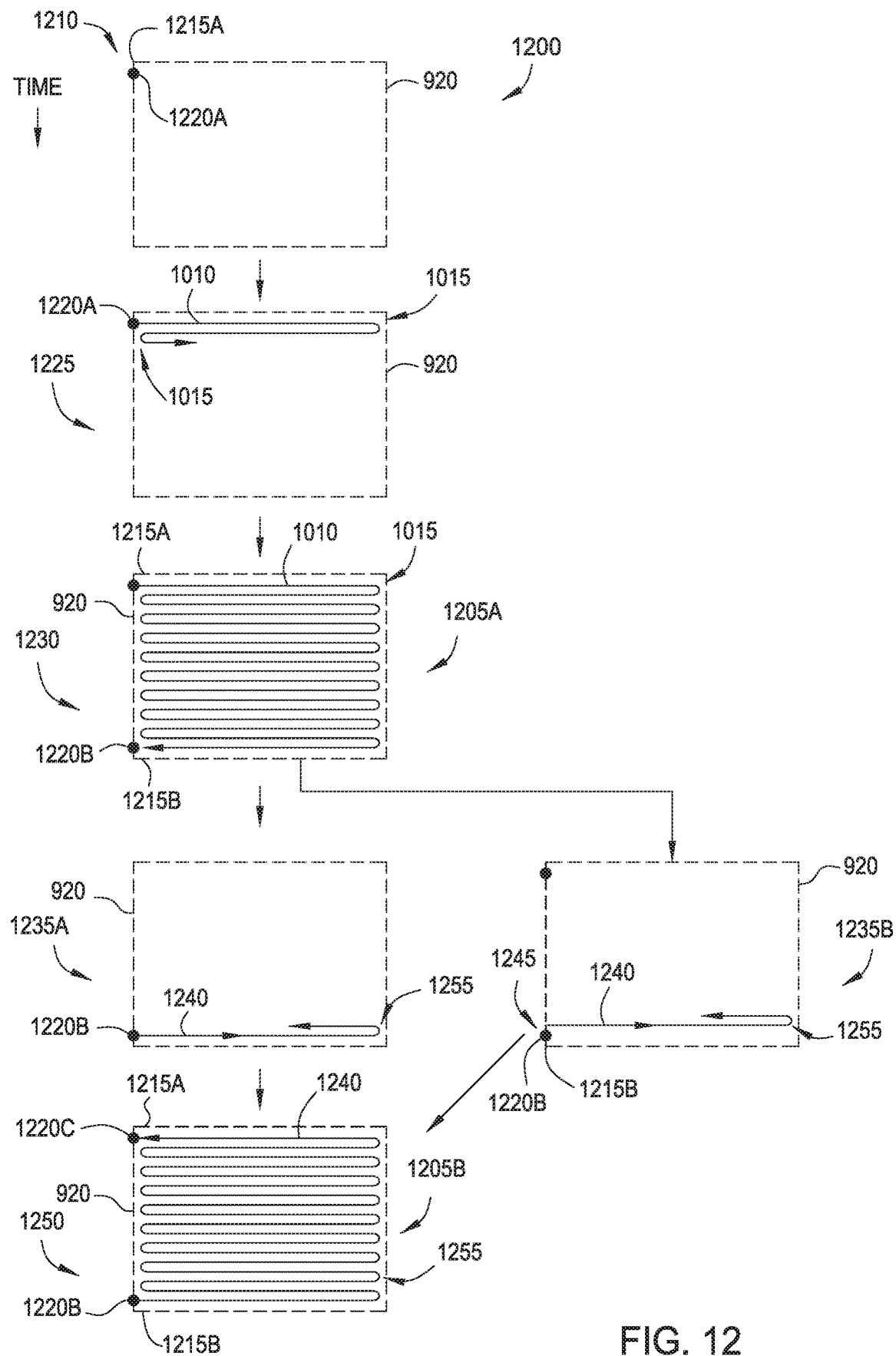
FIG. 12 is a schematic flow chart showing various embodiments of a polishing pattern that may be provided within a local area of a substrate utilizing the motion modes described in FIG. 9.

FIG. 12 is a schematic flow chart 1200 showing various embodiments of a polishing pattern (1205A, 1205B) that may be provided within a local area 920 at different times, such as time snapshots 1210, 1215, 1230, 1235A, 1235B and 1250 of the local area 920. The polishing patterns 1205A, 1205B may be provided utilizing the motion the support arm 130, the polishing pad assembly 125 and the substrate 115 by controlling the motion of the actuators coupled to each of these different components by use of the system controller 190. The polishing patterns 1205A, 1205B may each include a polishing pattern that is similar to the polishing pattern 1005 that is described above.

At 1210, the polishing pad assembly 125 may begin polishing at a first corner 1215A of the local area 920. A first point 1220A indicates the initial polishing at the first corner 1215A that begins a first line 1010 as shown at 1225. As shown in snapshot 1225, two first lines 1010 and two second lines 1015 are shown as the polishing pad assembly 125 traverses the local area 920. At snapshot 1230, the polishing pattern 1205A stops or ends at a second point 1220B at a second corner 1215B. At snapshot 1230, the polishing pattern 1205A has traversed across the local area 920 by following a continuous path that extends from the first corner 1215A to the second corner 1215B. In some embodiments, a downforce or pressure applied to the polishing pad assembly 125 may be increased from a zero pressure to a desired polishing pressure at the first point 1220A at the start of a polishing pattern 1205A, 1205B and/or decreased at the second point 1220B from a desired polishing pressure to a zero pressure at the end of the polishing pattern 1205A, 1205B. The process of varying the downforce or pressure applied to the polishing pad assembly 125 at the starting point and/or the ending point of a polishing pattern may be utilized to decrease defects generated by the polishing pad assembly 125 at the beginning and/or the end of the polishing pattern.

Snapshots 1235A and 1235B indicate alternative embodiments for providing the polishing pattern 1205B shown at snapshot 1250. Snapshot 1235A shows a line 1240 (similar to the first line 1010 except in an opposite direction as compared to snapshot 1225) and a line 1255 (similar to the second line 1015 except in an opposite direction as compared to snapshot 1225) that are formed by the coordinated motion of the support arm 130, the polishing pad assembly 125 and the substrate 115. In the snapshot 1235A configuration, the polishing pattern 1205B starts by traversing substantially the same pattern of first lines 1010 and second lines 1015 as shown in snapshot 1230 except in an opposite direction.

In contrast, at snapshot 1235B, the line 1240 is adjusted so that the first lines 1010 and second lines 1015 of the polishing pattern 1205B are not at the same position as the first lines 1010 and second lines 1015 of the polishing pattern 1205A. In one example, the first lines 1010 and second lines 1015 are offset by a distance indicated at 1245 so that the polishing pattern 1205B does not traverse the same path as the polishing pattern 1205A. The polishing pattern 1205B provided by the line 1240 in snapshot 1235B may be between at least the first lines 1010 shown in the polishing pattern 1205A of snapshot 1230 (as well as being in an opposite direction).

In either of the polishing patterns 1205A and 1205B, the polishing stops at point 1220C. The polishing patterns 1205A and 1205B may be provided over the same local area 920. However, in some embodiments, the polishing pattern 1205A may be used on one local area 920 while the polishing pattern 1205B may be used on another local area 920. In other embodiments, the polishing patterns 1205A and 1205B may be utilized on the same local area 920 one, two, three, or more times. The polishing pad assembly 125 may be conditioned after each polishing pattern 1205A, 1205B is completed, or at another suitable interval.

It has been found that using slurries containing ceria provide a removal rate that increases from point 1220A to 1220C. To avoid having variations in the amount of material removed across a local area 920, complementary polishing patterns, such as polishing pattern 1205A, 1205B, can be used to average out the effect of the increasing polishing rate with time. In some embodiments, the system controller 190 is configured to utilize different polishing patterns to adjust for the variation in the material removal rate as a function of time. This may be advantageously used to increase removal rate and polishing uniformity.

Substrates polished using the polishing module 100, 200, 800 and 900 with the polishing pad assembly 125 as described herein shows an improved material removal profile. Oscillating the polishing pad assembly 125 using one or more sweep motions of the arm and a radial motions by the actuator has been shown to improve material removal uniformity (average removal rate) as opposed to motion without oscillation. Other test showed that the oscillation mode was less sensitive to flatness of the substrate receiving surface 205 of the chuck 110 (shown in FIGS. 2A and 2B). For example, a substrate was shimmed at one position such that the substrate was not flat, and average removal rate was substantially uniform the when the chuck 110 was angled relative to the polishing pad assembly 125 (along with one or more of a sweep motion, a radial motion, and substrate rotation) as opposed to a removal rate without oscillation.

While the foregoing is directed to embodiments of the present disclosure, other and further embodiments of the disclosure may be devised without departing from the basic scope thereof, and the scope thereof is determined by the claims that follow.

The invention claimed is:
1. A polishing module, comprising:
a base;
a chuck coupled to the base and having a substrate receiving surface and a perimeter, the substrate receiving surface having a center;

one or more polishing pad assemblies positioned about the perimeter of the chuck and overlying the chuck, wherein each polishing pad assembly of the one or more polishing pad assemblies are coupled to an actuator assembly that provides a first movement of a respective one polishing pad assembly of the one or more polishing pad assemblies in a first arcuate direction having a first center of rotation at the center of the substrate receiving surface and wherein the actuator assembly further provides a second movement of the respective one polishing pad assembly of the one or more polishing pad assemblies in a second arcuate direction having a second center of rotation that does not coincide with the first center of rotation;

a support arm coupled to a corresponding one polishing pad assembly of the one or more polishing pad assemblies; and a linear movement mechanism coupled between the support arm and the base, wherein the linear movement mechanism is configured to provide a third movement of the support arm and the corresponding one polishing pad assembly in a radial direction relative to the center of the substrate receiving surface and the base, and wherein at least one of the first movement, the second movement, and the third movement are utilized to polish only a local area on a substrate disposed on the substrate receiving surface.

2. The module of claim 1, wherein each of the one or more polishing pad assemblies are coupled to a polishing head.

3. The module of claim 2, wherein the actuator assembly includes a motor positioned therein that is coupled to a shaft and a rotor.

4. The module of claim 3, wherein the shaft is eccentrically shaped.

5. The module of claim 3, wherein the rotor is eccentrically shaped.

6. The module of claim 2, wherein the polishing head comprises a housing coupled to a support member.

7. The module of claim 6, wherein the housing is coupled to the support member by two or more flexible posts that maintain the support member and the housing in a substantially parallel relationship.

8. The module of claim 6, wherein the housing includes a housing base having a volume formed therein.

9. The module of claim 8, wherein the volume is operable to provide a fluid flow path through the housing and to the respective one of the one or more polishing pad assemblies.

10. A polishing module, comprising:
a base;
a chuck coupled to the base and having a substrate receiving surface and a perimeter, the substrate receiving surface having a center;
a plurality of polishing heads disposed in radial positions about the perimeter;
a polishing pad assembly overlying the chuck and disposed in a housing that is coupled to a polishing head of plurality of polishing heads, wherein the polishing pad assembly is coupled to an actuator assembly that provides a first movement of the polishing pad assembly in a first arcuate direction having a first center of rotation at the center of the substrate receiving surface and the base and wherein the actuator assembly further provides a second movement of the polishing pad assembly in a second arcuate direction having a second center of rotation that does not coincide with the first center of rotation, and the actuator assembly provides the first movement between the polishing pad assembly and the housing;
a support arm coupled to the polishing pad assembly; and
a linear movement mechanism coupled between the support arm and the base, wherein the linear movement mechanism is configured to provide a third movement of the support arm and the polishing pad assembly in a radial direction relative to the center of the substrate receiving surface and the base, wherein at least one of the first movement, the second movement, and the third movement is utilized to polish only a local area on a surface of a substrate disposed on the substrate receiving surface, and wherein the local area consists of a surface area of a single die formed on the surface of the substrate.

11. The module of claim 10, wherein the actuator assembly includes a motor that is coupled to a shaft and a rotor.

12. The module of claim 11, wherein the shaft is eccentrically shaped.

13. The module of claim 11, wherein the rotor is eccentrically shaped.

14. The module of claim 10, wherein two or more flexible posts are coupled between a support member and the housing that maintain the support member and the housing in a substantially parallel relationship.

15. The module of claim 10, wherein the housing includes a housing base having a volume formed therein.

16. The module of claim 15, wherein the volume provides a fluid flow path through the housing and to the polishing pad assembly.

17. A polishing module, comprising:
a base;
a chuck coupled to the base and having a substrate receiving surface and a perimeter, the substrate receiving surface having a center;
a plurality of polishing heads positioned about the perimeter of the chuck, each of the plurality of polishing heads coupled to a respective housing having a polishing pad assembly disposed thereon, wherein each of the plurality of polishing heads are coupled to an actuator assembly overlying the chuck and that provides a first movement of the polishing pad assembly in a first arcuate direction having a first center of rotation at the center of the substrate receiving surface and the base and wherein the actuator assembly further provides a second movement of the polishing pad assembly in a second arcuate direction having a second center of rotation that does not coincide with the first center of rotation, and the actuator assembly includes a motor that is coupled to a shaft and a rotor that provides the first movement between the polishing pad assembly and the respective housing;
a support arm coupled to the polishing pad assembly; and
a linear movement mechanism coupled between the support arm and the base, wherein the linear movement mechanism is configured to provide a third movement of the support arm and the polishing pad assembly in a radial direction relative to the center of the substrate receiving surface and the base, and wherein at least one of the first movement, the second movement, and the third movement is utilized to polish only a local area on a surface of a substrate disposed on the substrate receiving surface.

18. The module of claim 17, wherein the shaft is eccentrically shaped.

19. The module of claim 17, wherein the rotor is eccentrically shaped.

20. The module of claim 17, wherein each of the plurality of polishing heads are coupled to a common actuator.

* * * * *